United States Patent [19]
Nishizawa et al.

[11] Patent Number: 4,719,499
[45] Date of Patent: Jan. 12, 1988

[54] SEMICONDUCTOR IMAGING DEVICE

[75] Inventors: Junichi Nishizawa, No. 6-16, Komegafukuro 1-chome, Sendai-shi, Miyagi; Takashige Tamamushi; Sobei Suzuki, both of Miyagi, all of Japan

[73] Assignee: Junichi Nishizawa, Japan

[21] Appl. No.: 882,454

[22] Filed: Jul. 8, 1986

Related U.S. Application Data

[63] Continuation of Ser. No. 782,141, Sep. 30, 1985, abandoned, which is a continuation of Ser. No. 561,105, Dec. 13, 1983, abandoned.

[30] Foreign Application Priority Data

Dec. 13, 1982 [JP]  Japan ................... 57-218588

[51] Int. Cl.⁴ .................. H01L 27/14; H04N 3/14
[52] U.S. Cl. ......................... 357/30; 357/22; 358/213.12
[58] Field of Search ............ 357/30, 22 B, 22 D, 357/30 H, 30 I, 30 R; 358/212, 213.12

[56] References Cited
FOREIGN PATENT DOCUMENTS 105672 6/1983 Japan ................ 357/30
45781 3/1984 Japan ................ 357/30

Primary Examiner—James W. Davie
Attorney, Agent, or Firm—Sughrue, Mion, Zinn, Macpeak and Seas

[57] ABSTRACT

A semiconductor imaging device employing SIT (Static Induction Transistor) pixels having in the control gate region of each pixel a capacitor having optimum properties. Each pixel is constituted by an SIT having a pair of principal electrode regions of one conduction type facing one another through a highly resistive channel region. First and second gate regions of the other conduction type in contact with the channel region control the current flow between the two principal electrode regions. A transparent electrode is formed on at least part of the first gate region through a capacitor. Carriers generated by light excitation stored in the first gate region effectively control the current flow between the principal regions. A transparent electrically conductive layer is formed on the first gate region of each SIT through a nitride layer. The conductive layer serves as an electrode to connect the first gate region to the output of a gate control circuit.

7 Claims, 9 Drawing Figures

SEMICONDUCTOR IMAGING DEVICE

This is a continuation of application Ser. No. 782,141, filed Sept. 30, 1985, abandoned which is a continuation of application Ser. No. 561,105 filed Dec. 13, 1983, abandoned,

BACKGROUND OF THE INVENTION

The present invention relates to a semiconductor imaging device employing an SIT (Static Induction Transistor) as a pixel unit. More particularly, the invention relates to the structure in such a device of a capacitor on a control gate where photocarriers are stored.

A pixel having a new structure was recently proposed in Japanese Patent Application No. 157693/82. This pixel is composed of an SIT having two gates, one a control gate acting as a photocell and the other a shielding gate used to isolate pixels and adjust their sensitivity. This pixel functions as a light detector that operates in response to a pulse input with the use of a blocking capacitor to limit the d.c. component of the current flowing through the control gate. In addition to structural simplicity, this pixel has a high gain and has a large noise margin. Furthermore, this pixel is capable of high-speed operation and permits the sensitivity to be controlled by purely electronic means.

The blocking capacitor mentioned above, which is used to store photocarriers, is an important element that determines the overall characteristics of the pixel. When an SIT is used as a pixel unit for forming a semiconductor imaging device, the carrier storage capacitor connected to the control gate of the transistor is required to meet the following requirements:

(1) The area of the capacitor cannot be greater than the size of the control gate. This means that the area of the capacitor is limited by the area of a pixel unit. On the other hand, the demand for reducing the size of pixel is ever increasing.

(2) In order to maintain the ability to store photocarriers, the capacitor must employ an insulating layer that has low leadage current characteristic.

(3) For practical purposes of signal reading, the imaging device must operate consistently with a fairly small pulsive voltage. To this end, capacitors having the desired capacitance must be easily produced.

(4) From a process viewpoint, the capacitor should have a simple structure.

These requirements are well recognized by IC manufacturers, but the specific capacitor configuration that produces optimum results has been entirely unknown.

It has recently been confirmed that with an imaging device using SITs, a pixel producing a greater output can be fabricated by increasing the capacitance of the capacitor, provided that it is within a certain range. Therefore, the provision of good capacitor having a large capacitance has been a very important prerequisite for manufacturing high-efficiency pixels using SITs.

The primary object of the present invention is to provide a semiconductor imaging device employing an SIT pixel which has in the control gate region a capacitor having optimum properties, namely, a small leakage current (within an allowed tolerance), large capacitance and good quality.

SUMMARY OF THE INVENTION

The above object is achieved by a semiconductor imaging device including a plurality of pixels, each formed with an SIT which includes a pair of principal electrode regions of one conduction type disposed facing each other through a channel region made of a high resistivity semiconductor material, and first and second gate regions of the other conduction type formed in contact with the channel region and used for controlling the current flow between the two principal electrode regions. A transparent electrode is formed on at least part of the first gate region through a capacitor. Carriers generated by light excitation stored in the first gate region effect control over the current flow between the two principal electrode regions. An electrically conductive layer, which is transparent to the electromagnetic waves to be detected, is formed on the first gate region of each SIT, at least through a nitride layer. The conductive layer serves as the electrode for the first gate region and is connected to the output of a gate control circuit.

DESCRIPTION OF THE PREFERRED EMBODIMENTS

Figure 1:
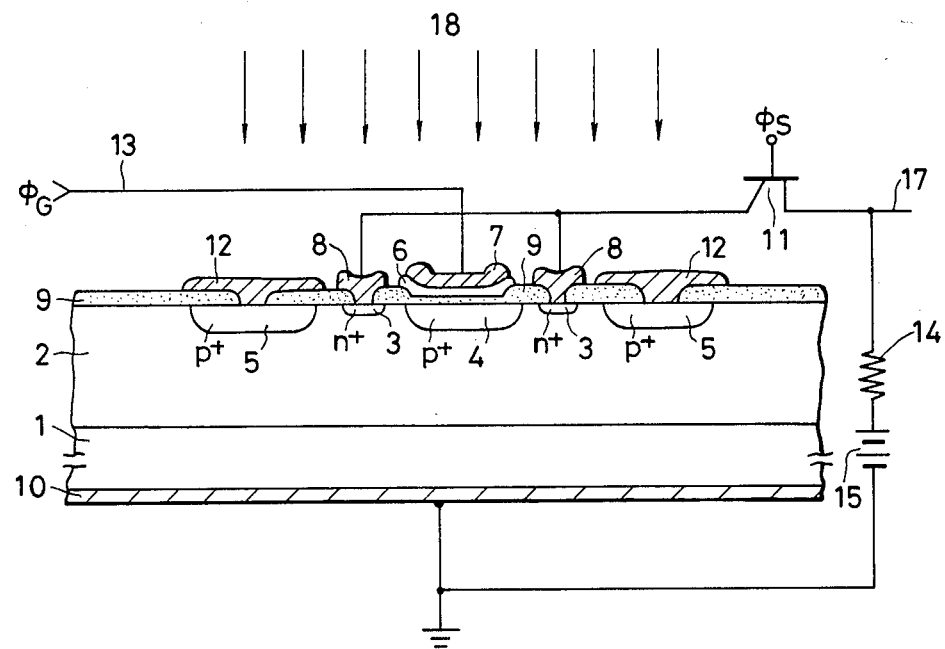
FIGS. 1, 3 and 9 show in cross section essential parts of three different embodiments of a pixel used in a semiconductor imaging device of the present invention.

A cross section of a preferred embodiment of a pixel used in the semiconductor imaging device of a present invention is shown in FIG. 1. In FIG. 1, 1 is an Si substrate of the n+ type, 2 is a highly resistive layer of the n− (or intrinsic) type, 3 is one principal electrode (drain) of the n+ type having a high impurity concentration, 4 is a first gate (control gate) of the p+ type having a high impurity concentration, 5 is a second gate (shielding gate) of the p+ type having a high impurity concentration, 6 is an $Si_3N_4$ layer, 7 is an $SnO_2$ layer serving as a control gate electrode, 8 is a drain electrode, 9 is an $SiO_2$ layer, 10 is a source electrode, 11 is a switching transistor, $\phi_s$ is a transistor control signal, 12 is a shielding gate electrode, 13 is a selection line over which a reading pulse signal $\phi_G$ is applied to the $SnO_2$ layer 7 from a pixel selection circuit (not shown), 14 is a load resistor, 15 is a video voltage source, 17 is an output terminal, and 18 indicates incident light. In the embodiment of FIG. 1, the transparent and conductive $SnO_2$ layer 7 is formed on the control gate 4 through the $SiO_2$ layer 9 and the $Si_3N_4$ layer 6. The combination of these layers provides a capacitor, the layers 6 and 7 forming the electrodes and the layer 9 the dielectric.

The control gate 4 and shielding gate 5 shown in FIG. 1 are formed by first forming the SiO$_2$ layer 9 on the entire surface of the wafer, then lightly etching the area where the two gates are to be formed, and finally implanting arsenic through the resulting thinned layer of SiO$_2$ layer. The next step of forming the drain 3 starts with the complete removal of the SiO$_2$ layer in the area where the drain is to be formed. However, in this step, the SiO$_2$ layer on the control gate 4 and the shielding gate 5 is left intact as a mask. (An additional step is required to remove this mask later.) Therefore, in the embodiment of FIG. 1, the SiO$_2$ layer 9 on the control gate 4 is left intact and the insulating Si$_3$N$_4$ layer 6 is immediately formed thereon. Insulating layers can be made of oxides such as SiO$_2$ or Al$_2$O$_3$, or nitrides such as Si$_3$N$_4$. Oxides are conventionally employed since they can be easily shaped. However, according to the present invention, a nitride layer is used as one component of the gate capacitor.

As a result of computer simulation and evaluation of the operating characteristics of SIT imaging pixels that the present inventors have conducted using an externally formed capacitor, it has been concluded that a nitride layer is the best material in that satisfies the four requirement for the gate capacitor more effectively than the conventional insulating layer. The evaluation of the capacitor performance must be made not only with respect to the properties of the insulating layer per se, but also with respect to its match with the overlying and underlying layers.

The layer 6, 7 and 9 that make up the control gate capacitor of the SIT pixel of FIG. 1 function as follows. First assume the case where no photocarriers are stored in the p+ control gate 4 because there is no illumination or incident light is blocked from the shielding gate 5 by a suitable shielding means (not shown). In order to form the SIT pixel, the impurity concentration in the n− type channel region 2 should not exceed about $1 \times 10^{16}$ cm$^{-3}$, while the impurity concentration in each of the gate, source and drain regions should be greater than about $1 \times 10^{18}$ cm$^{-3}$. In order to prevent the flow of a drain-source current when there is no gate voltage, the dimensions and inter-gate spacing must be selected so that the diffusion potential alone is sufficient for creating a depletion of layer between the two gate regions and in the channel region. The potential distribution through the thickness of the wafer directly beneath the p+ region of the control gate 4 or the shielding gate 5 is such that the surface layer (p+ region) has a higher potential than the source 10 (n+ region), thus forming a diode between the gate region 4 or 5 and the n+ type Si substrate 1.

In the absence of a bias from the video voltage source 15, the drain 3 and source 10 have an equal potential throughout the thickness of the wafer directly under the n− drain 3, with a maximum potential existing at a point (hereafter, the "true gate point") somewhere between the two regions. Therefore, even if a bias voltage is applied between the drain 3 and source 10, the potential barrier created by that true gate point provides an expanded depletion layer that pinches off any drain current. In the absence of bias from the voltage source 15, no drain current will flow, even if a pulse of the gate control pulse signal $\phi_G$ is applied to the gate electrode 7 through the selection line 13. Needless to say, no current will flow during illumination if either a pulse of the signal $\phi_G$ or bias from video voltage source 15 is applied.

The operation of the SIT pixel can be summarized as follows: When the control gate 4 is illuminated, photocarriers (holes) are stored in the underlying p+ region in an amount that depends on the intensity of the light. If bias from the video voltage source 15 is applied between the drain 3 and source 10 in response to a pulse of the control signal $\phi_S$, the potential of the true gate formed directly beneath the n+ drain is determined at a certain value. Under these conditions, when the positive bias of gate pulse signal $\phi_G$ is applied to the drain electrode 7, a voltage depending on the magnitude of that pulse is applied to the gate capacitor composed of the gate electrode 7, insulating layer 6 and oxide layer 9. This gate capacitor is connected in series with an equivalent diode capacitor ($C_{DS}$) between the p+ type control gate region and the source region 10. The voltage of the pulse signal $\phi_G$ is divided between the gate capacitor and diode capacitor ($C_{DS}$). As a result, the terminal voltage of the diode, hence the true gate potential, is reduced. Only when this condition is met do the photocarriers stored in the control gate overcome the potential barrier and establish a current flowing between the drain and source. Since the values of the video voltage and gate control pulse are constant, it is very important that the control gate capacitor formed in each pixel have a constant and uniform capacitance and that the leakage current be minimized.

Experiments conducted by the present inventors using an externally formed control gate capacitor revealed that, for practical purposes, a capacitance in the range of 0.1 to several decades of picofarads is necessary for each pixel. Compared with oxides having a dielectric constant on the order of 3.2, nitrides such as Si$_3$N$_4$ have values on the order of 5.0, and hence are advantageous for forming a capacitor having a high capacitance value. Furthermore, nitrides provide a dense layer which can be thinned without forming pinholes. Another advantage from a process viewpoint is that a uniform layer can be produced at low temperatures. Preferred nitrides are those which can be used as a mask for the wet etching of an oxide layer.

The SnO$_2$ layer 7 shown in FIG. 1 forms a transparent electrode which has a high transmittance for visible light of shorter wavelengths, and hence can be combined with the Si$_3$N$_4$ layer 6 to provide a pixel suitable for use with visible light in the shorter wavelength ranges. However, the breakdown voltage of SnO$_2$ is lower than that of polysilicon. Therefore, if a greater dielectric strength is required, the SnO$_2$ layer 7 is preferably replaced by a polysilicon layer. The control gate 4 shown in FIG. 1 is of the p+ type, but it should be understood that an n+ type control gate may also be used.

Figure 2:
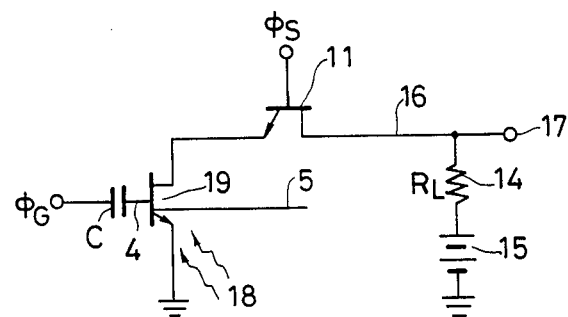
FIG. 2 shows an equivalent circuit of the devices of FIG. 1.

An equivalent circuit of the device depicted FIG. 1 is shown in FIG. 2. When holes generated by illumination with incident light 18 are stored in the control gate region 4, when the base (or gate) of transistor 11 and the drain electrode 7 of SIT 19 are supplied with pulses of the signals $\phi_S$ and $\phi_G$, respectively, a drain current having a magnitude depending upon the intensity of the light input 18 flows through the video lie, and an optical output signal is picked up at the terminal 17. The optical output at the terminal 17 varies greatly with the intensity of the incident light 18, and hence a wide dynamic range is obtained. The resulting gain is about $10^3$, which is at least ten times that of the conventional bipolar transistor.

One function of the gate capacitor indicated at C in FIG. 2 is to transmit the pulse signal $\phi_G$. The other function is to store photocarriers while blocking the passage of d.c. current. The shielding gate 5, in conjunction with the control gate 4, controls the channel formed in the n$^-$ layer directly beneath the drain 3. At the same time, the shielding gate provides electrical isolation between integrated pixels.

Figure 3:
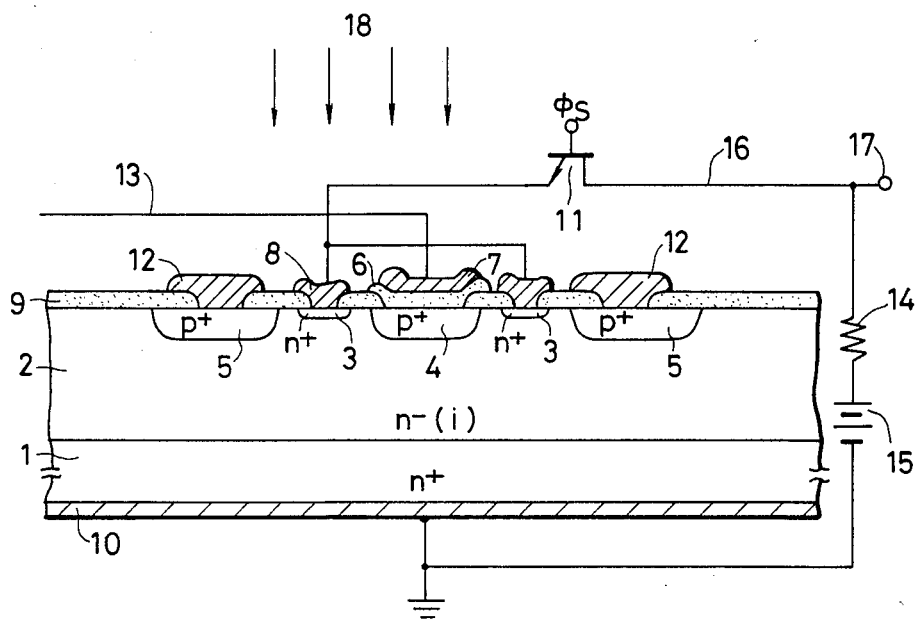

FIG. 3 shows in cross section another embodiment of the pixel used in the semiconductor imaging device of the present invention. In this embodiment, the $SiO_2$ layer 9 is omitted and the $SnO_2$ layer 7 is formed on the control gate 4 only with the $Si_3N_4$ layer 6. In the embodiment of FIG. 1, the $SiO_2$ layer 9 forms an equivalent series capacitor, and hence the capacitance of the nitride layer 6 cannot be substantially increased by reducing its thickness. This problem is absent from the embodiment of FIG. 3. Furthermore, if there is no oxide layer under the nitride layer, an equivalent diode having better electrical characteristics can be formed within the wafer. As mentioned above, this diode has as its anode the p$^+$ region of the control gate 4, and the drain region 10 as its cathode. Moreover, the simplicity of the arrangement of FIG. 3 leads to another advantage, namely, strong adhesion between the two capacitor layers.

The thickness of the $Si_3N_4$ layer 6 preferably ranges from 50 Å to 2000 Å. If this thickness is less than 50 Å, a tunnel current will flow and the layer will have no insulating effect. If the layer thickness exceeds 2000 Å, cracking can easily occur.

The $SnO_2$ layer 7 shown in FIG. 3 may be replaced by a doped polycrystalline silicon layer (DOPOS) or an aluminum layer. Aluminum has a higher breakdown voltage than $SnO_2$ and DOPOS and is suitable for forming a pixel for detecting high-energy radiation such as electron beams. Aluminum is also usable if the control gate 4 is of the n$^+$ type. According to experiments conducted by the inventors, an $Si_3N_4$ layer 1000 Å thick was found to have a maximum capacitance of 450 to 500 pF/mm$^2$ whether the transparent electrode 7 was made of $SnO_2$, DOPOS OR Al.

Figure 4:
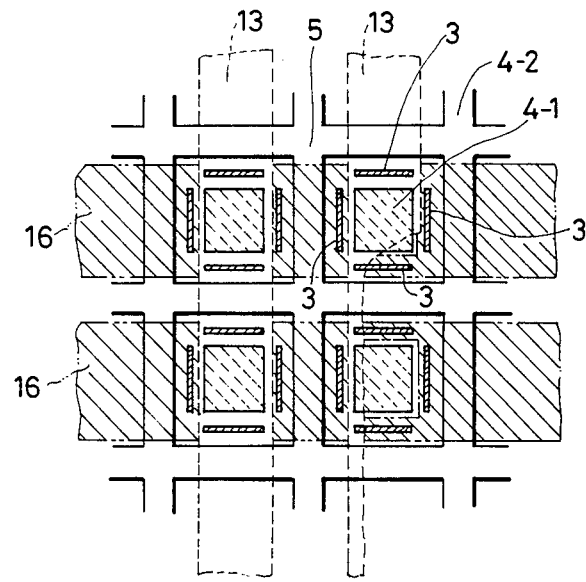
FIG. 4 is a plan view of pixels arranged two-dimensionally.

FIG. 4 is a plan view of a preferred embodiment of a semiconductor imaging device of the present invention wherein pixels are arranged in a matrix form. In this Figure, 4-1 is a light-receiving control gate region, 3 is a drain region, 4-2 and 5 are shielding gate regions, 13 is a lead over which a gate control pulse signal is applied, and 16 is a video signal line. A two-dimensional semiconductor imaging device of the type shown in FIG. 4 was fabricated using a control gate capacitor having the layer arrangement shown in FIG. 3 in which $SnO_2$ was used for the transparent electrode 7, and $Si_3N_4$ for the layer 6 at a thickness of 700 Å. Other device parameters were as follows: 2 microns for the depth of the gate region of p$^+$ type, 11 microns for the thickness of the high resistivity n$_-$ layer 2, and 100×100 microns for the size of each pixel. The pixels were found to have very uniform light intensity vs. output voltage characteristics. This indicates the uniformity of the $Si_3N_4$ layer used in each pixel.

Figure 5:
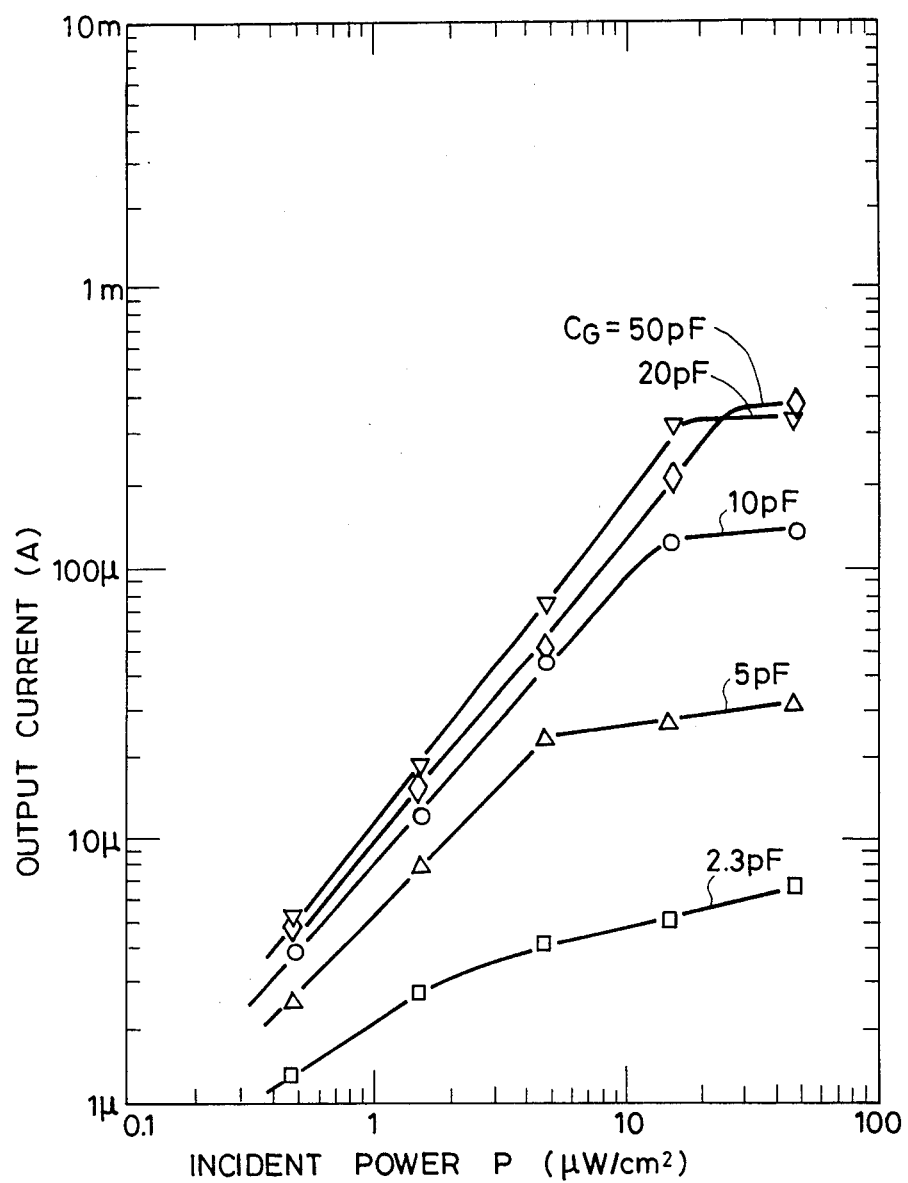
FIG. 5 is a graph showing the light intensity vs. output current characteristics of the pixel of the invention for various values of the capacitance of the control gate capacitor.

A pixel was fabricated using a capacitor according to the present invention for the control gate 4. The output characteristics were measured for five different values of capacitance, 2.3, 5, 10, 20 and 50 pF. The results are shown in the graph of FIG. 5 wherein plotted on the horizontal axis is the power of the incident light and on the vertical axis the output current. The graph shows that, within a certain range, the performance of the pixel is improved as the capacitance value of the capacitor is increased.

Figure 6:
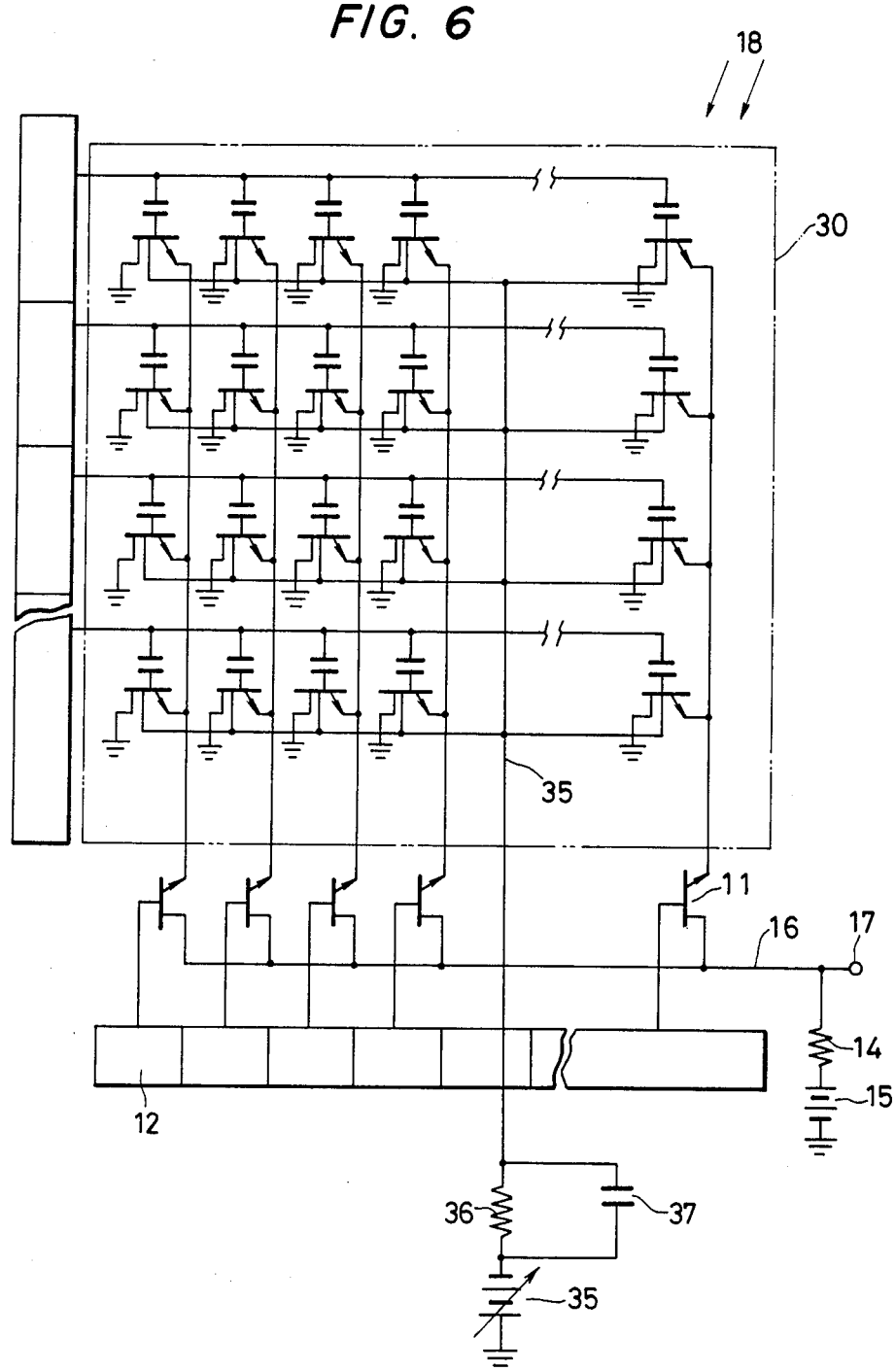
FIG. 6 is a circuit diagram for essential parts of the imaging device of the present invention wherein pixels are arranged in matrix form.

FIG. 6 is a circuit diagram of essential parts of the semiconductor imaging device wherein SIT pixels are arranged two-dimensionally as shown in FIG. 4. The matrix of pixels is generally indicated at 30. The shielding gate of each pixel is either grounded or fixed to a suitable reverse-bias potential through a circuit composed of a voltage source 35, a resistor 36 and a capacitor 37. 11 is a switching transistor for selecting the proper video line selection pulse signal $\phi_S$, 14 is a load resistor, 15 is a video voltage source, and 18 indicates incident light.

Figure 7:
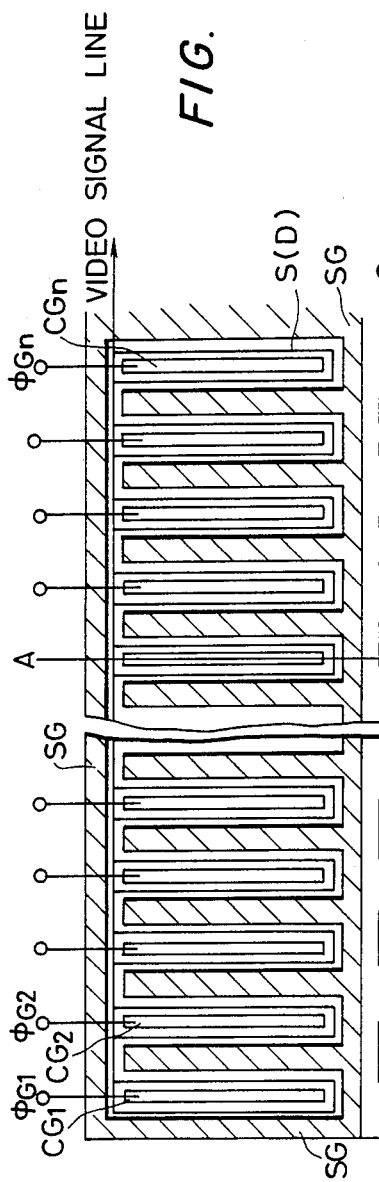
FIG. 7 is a plan view of pixels arranged one-dimensionally.

Another embodiment of a semiconductor imaging device of the present invention wherein SIT pixels are arranged one dimensionally to form a line sensor is shown in the plan view of FIG. 7. In FIG. 7, $CG_1$ to $CG_n$ are each control gate regions, SG is a shielding gate region, S(D) is a source or drain region, $\phi G_1$ to $\phi G_n$ are reading pulse signal, G is the gate of a MOS transistor that clears the shielding gate of excess photocarriers and which is formed on the same substrate as that used for the SIT pixels, and SD is the source or drain electrode of the MOS transistor.

Figure 8:
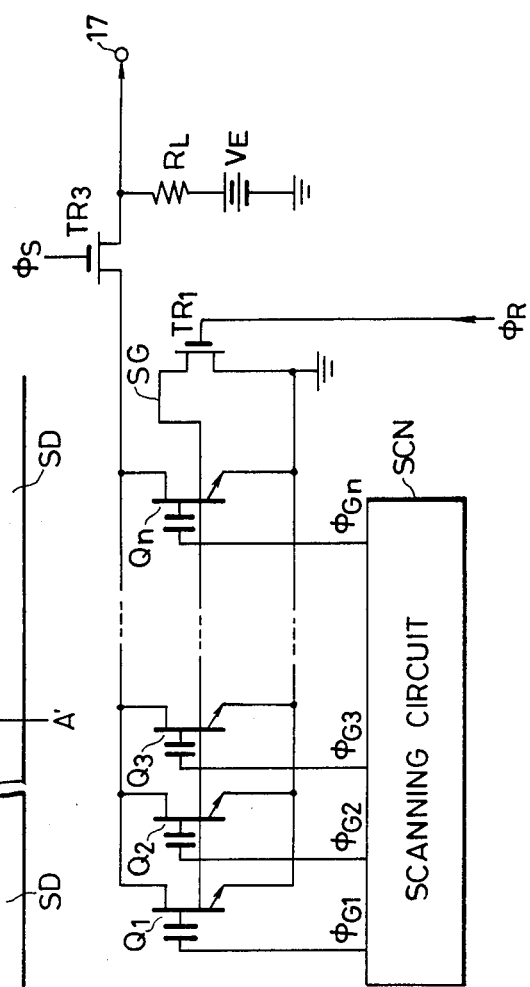
FIG. 8 is a circuit diagram for essential parts of the imaging device of the present invention where pixels are arranged one-dimensionally.

The equivalent circuit of the device of FIG. 7 is shown in FIG. 8, from which one can see that this device has the shielding gate common to all pixels and enables high-speed scanning by using the MOS transistor $TR_1$ to clear the shielding gate of excess photocarriers in response to the drive pulse signal $\phi_R$. In FIG. 8, the SIT pixels are indicated by $Q_1$ to $Q_n$, each of which is provided with a capacitor. The symbol $V_E$ denotes a video voltage source.

Figure 9:
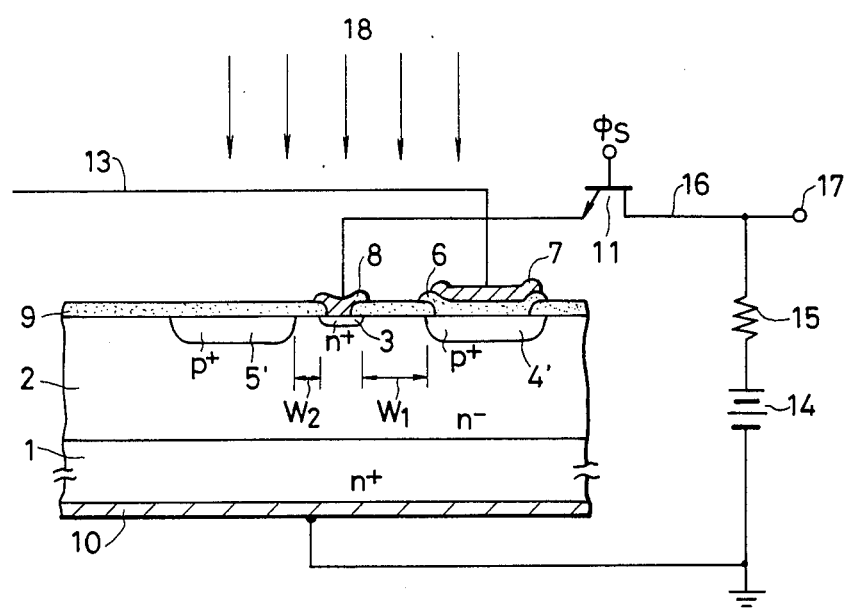

FIG. 9 shows in cross section the essential parts of another embodiment of a pixel that can be used in the semiconductor imaging device of the present invention. The layer arrangement of the control gate capacitor is the same as in FIG. 3 except that the distance $W_1$ between the p$^+$ type control region 4' and the drain region 3 is greater than the distance $W_2$ between the p$^+$ type shielding gate region 5' and the drain region. By employing this positional relationship, the photosensitivity of the shielding gate 5' is reduced and the control gate 4' becomes the only element that receives light.

In order to attain the same object, the diffusion potential $V_{bi}(S)$ across the shielding gate and drain regions may be made higher than the diffusion potential $V_{bi}(C)$ across the control gate and drain regions by making various modifications to the circuit configuration. Alternatively, all parts other than the control gate region may be covered with a layer of aluminum or other light-shielding material.

The foregoing description of the preferred embodiments assumes an n-type channel, but it should be understood that the concept of the present invention is also valid if the channel is p type. In the described embodiments, the video voltage source is connected to the n$^+$ type layer 3 on the gate side, whereas the n$^+$ type substrate 1 is grounded. However, it should also be understood that the video voltage may be applied to the electrode 10 on the substrate side with the n$^+$ layer on the gate side grounded.

As described in the foregoing, the semiconductor imaging device of the present invention is composed of a linear one-dimensional array or two-dimensional array of pixels, with each pixel being implemented with an SIT having drain and source regions and control gate and shielding gate regions. This device is characterized by a simple structure wherein one pixel is constituted by one transistor and yet provides a high gain of light amplification and with a low noise factor. Therefore, the device of the present invention can be fabricated in a compact form, permitting many pixels to be packed onto one chip, and enables high-speed operation. Furthermore, the control gate electrode for each pixel is made of an electrically conductive layer which is transparent to electromagnetic waves at the wave length to be detected and which is formed on the control gate at least through a nitride layer. Therefore, the control gate is provided with a good capacitor of high capacitance value that is capable of storage of photocarriers without significant leakage. For these reasons, the semiconductor imaging device of the present invention produces uniform optical output characteristics from a plurality of pixels and can operate in response to a low-level gate pulse.

I claim:

1. A semiconductor imaging device comprising a plurality of pixels each comprising a static induction transistor comprising: a pair of principal electrode regions of one conduction type disposed facing each other through a channel region formed of high-resistivity semiconductor material; first and second gate regions of the other conduction type formed in contact with said channel region for controlling current flow between said two principal electrode regions; and a transparent electrically conductive electrode formed over at least part of said first gate region, a capacitor thereby being formed having as electrodes said transparent electrode and first gate region and having at least a nitride layer between said transparent electrode and said first gate region, carriers generated by light excitation being stored in said first gate region so as to effect control over current flowing between said two principal electrode regions; wherein said transparent electrode is transparent to the electromagnetic waves of a wavelength to be detected and serves as an electrode to connect said first gate region to an output of a gate control circuit, wherein said pair of principal electrode regions constitute the two principal electrodes of said transistor and said first and second gate regions jointly constitute the gate of said transistor.

2. The device according to claim 1, wherein said transparent electrode is made of $SnO_2$.

3. The device according to claim 1, wherein said transparent electrode is made of doped polycrystalline silicon.

4. The device according to claim 3, wherein said nitride layer is formed on said first gate region through an $SiO_2$ layer.

5. The device according to claim 1, wherein said transparent electrode is made of aluminum.

6. The device according to claim 1, wherein said nitride layer is formed on said first gate region through an $SiO_2$ layer.

7. The device according to claim 1, wherein said nitride layer has a thickness between 50 and 1000 Å.

* * * * *